(12) United States Patent
Emberty et al.

(10) Patent No.: US 6,597,972 B2
(45) Date of Patent: Jul. 22, 2003

(54) INTEGRATED FAN ASSEMBLY UTILIZING AN EMBEDDED FAN CONTROLLER

(75) Inventors: Robert George Emberty, Tucson, AZ (US); Craig Anthony Klein, Tucson, AZ (US); Blanca Rodriguez, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 09/794,645

(22) Filed: Feb. 27, 2001

(65) Prior Publication Data

US 2002/0120367 A1 Aug. 29, 2002

(51) Int. Cl.[7] .......................... G05B 19/18; H05K 7/20
(52) U.S. Cl. .......................... 700/304; 700/9; 361/695
(58) Field of Search ............................ 700/9, 45, 170, 700/282, 304; 236/49.3, DIG. 9; 361/695

(56) References Cited

U.S. PATENT DOCUMENTS

| | | | | |
|---|---|---|---|---|
| 4,506,312 A | * | 3/1985 | Chan et al. ............... 361/240 |
| 4,656,553 A | | 4/1987 | Brown | |
| 5,102,040 A | | 4/1992 | Harvey | |
| 5,249,741 A | | 10/1993 | Bistline | |
| 5,436,827 A | * | 7/1995 | Gunn et al. ............... 700/82 |
| 5,687,079 A | * | 11/1997 | Bauer et al. ............... 700/70 |
| 5,727,928 A | * | 3/1998 | Brown ................... 417/44.11 |
| 5,906,315 A | | 5/1999 | Lewis | |
| 5,926,386 A | | 7/1999 | Ott | |
| 5,930,736 A | * | 7/1999 | Miller et al. ............... 702/127 |
| 6,037,732 A | * | 3/2000 | Alfano et al. ............... 318/471 |
| 6,247,898 B1 | * | 6/2001 | Henderson et al. ............ 417/3 |
| 6,268,664 B1 | * | 7/2001 | Rolls et al. ................ 307/32 |
| 6,390,379 B1 | * | 5/2002 | Huang ..................... 236/49.3 |
| 6,392,372 B1 | * | 5/2002 | Mays, II .................. 318/254 |
| 6,407,672 B1 | * | 6/2002 | Grenz et al. ............... 340/635 |
| 6,428,282 B1 | * | 8/2002 | Langley .................... 417/2 |

FOREIGN PATENT DOCUMENTS

WO   WO 98/01938   1/1998

\* cited by examiner

Primary Examiner—Leo Picard
Assistant Examiner—Elliot Frank
(74) Attorney, Agent, or Firm—Robert M. Sullivan; Bracewell & Patterson, L.L.P.

(57) ABSTRACT

A fan controller for use with a variable speed fan. The fan controller includes a processor coupled to a communication circuit that, in an advantageous embodiment, includes a universal asynchronous receiver transmitter (UART). The communication circuit allows an external controller to monitor and establish a desired speed setting of the variable speed fan. The fan controller also includes a memory device, such as an electrically erasable programmable read only memory (EEPROM), coupled to the processor, that contains the desired speed setting of the variable speed fan. The fan controller further includes a feedback circuit, coupled to the processor, that receives a feedback signal indicative of the variable speed fan operation and a fan driver circuit, coupled to the processor, that provides a driving signal to control a speed of the variable speed fan.

20 Claims, 4 Drawing Sheets

INTEGRATED FAN ASSEMBLY UTILIZING AN EMBEDDED FAN CONTROLLER

BACKGROUND OF THE INVENTION

1. Technical Field

The present invention relates in general to cooling systems for electronic devices and, in particular, to cooling fans. More particularly, the present invention relates to an integrated fan assembly that utilizes a embedded fan controller.

2. Description of the Related Art

Integrated circuits and other electrical devices generally have rated operating temperature ranges. Within these operating ranges, the devices behave according to specified requirements. Outside of the rated operating range, the response characteristics of the circuits and devices can vary from the specified requirements. At elevated temperatures, it is known for integrated circuits and other electrical devices to fail or burn out or otherwise become defective. Accordingly, it is desirable to maintain circuits and devices within their rated operating temperature ranges.

In a computer system, continued operation of an electronic device leads to the generation of heat. In some instances, albeit rare, ambient air is sufficient to provide cooling to maintain the circuit or device within the desired operating temperature range. However, some circuits or components generate enough heat to require affirmative cooling from a cooling fan. Typically, computers have included a cooling fan inside the computer housing to prevent overheating caused by the normal operation of the computer. Also, it not uncommon for a computer system, such as a server system, to utilize more than one cooling fan to maintain a specified operating temperature.

Computer systems must monitor their cooling fans to verify that the fans are powered on and rotating at a predetermined speed to maintain a desired thermal condition that precludes accelerated failures of electronic devices utilized in the computer systems. Typically, each cooling fan generates a "feedback" signal that provides information, such as rotational speed. The feedback signal is generally a "tach" signal that is essentially a pulse train where each pulse represents a complete revolution of a fan blade. A monitoring processor, typically a system processor, receives this feedback signal at a fan sense pin.

The speed at which a cooling fan is operated is generally a function of the heat dissipation and acoustical noise requirements of the system in which it is utilized. For example, a fan operating at a high speed typically generates a higher noise level than a fan operating at a lower speed. The different cooling and acoustic noise requirements result in a different fan speed operation requirements. Thus, a manufacturer must customize a cooling system for each different application. This, in turn, results in the manufacturer utilizing a different "custom" fan for each separate application or product, increasing the manufacturer's inventory and cost.

Accordingly, what is needed in the art is an improved cooling fan that mitigates the limitations discussed above. More particularly, what is needed in the art is a single cooling fan that can be operated at different speeds to accommodate the different environmental requirements of disparate systems or applications.

SUMMARY OF THE INVENTION

It is therefore an object of the invention to provide an improved cooling fan.

It is another object of the invention to provide an integrated fan assembly with an embedded fan controller.

To achieve the foregoing objects, and in accordance with the invention as embodied and broadly described herein, a fan controller for use with a variable speed fan is disclosed. The fan controller includes a processor coupled to a communication circuit that, in an advantageous embodiment, includes a universal asynchronous receiver transmitter (UART). The communication circuit allows an external controller to monitor and establish a desired speed setting of the variable speed fan. The fan controller also includes a memory device, such as an electrically erasable programmable read only memory (EEPROM), coupled to the processor, that contains the desired speed setting of the variable speed fan. The fan controller further includes a feedback circuit, coupled to the processor, that receives a feedback signal indicative of the variable speed fan operation and a fan driver circuit, coupled to the processor, that provides a driving signal to control a speed of the variable speed fan.

The fan controller along with the associated variable speed fan constitutes a "phase locked loop" system where the variable fan speed is constantly monitored and adjusted accordingly to meet the predetermined speed requirements of the overall system where it is employed. The predetermined, i.e., desired, speed is contained in the memory device and the fan motor currents are adjusted until the desired speed is obtained. The fan controller communicates with and is typically under the control of a supervisory processor of the host machine via a bidirectional bus, allowing the fan controller to notify the supervisory processor of any existing problems. The present invention permits the utilization of a single fan assembly for use with disparate systems having different cooling requirements. The speed settings for the different cooling environments can be "flashed" into the memory device of the fan controller, thus allowing a single fan assembly to be inventoried reducing overall costs in manufacturing and operation.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
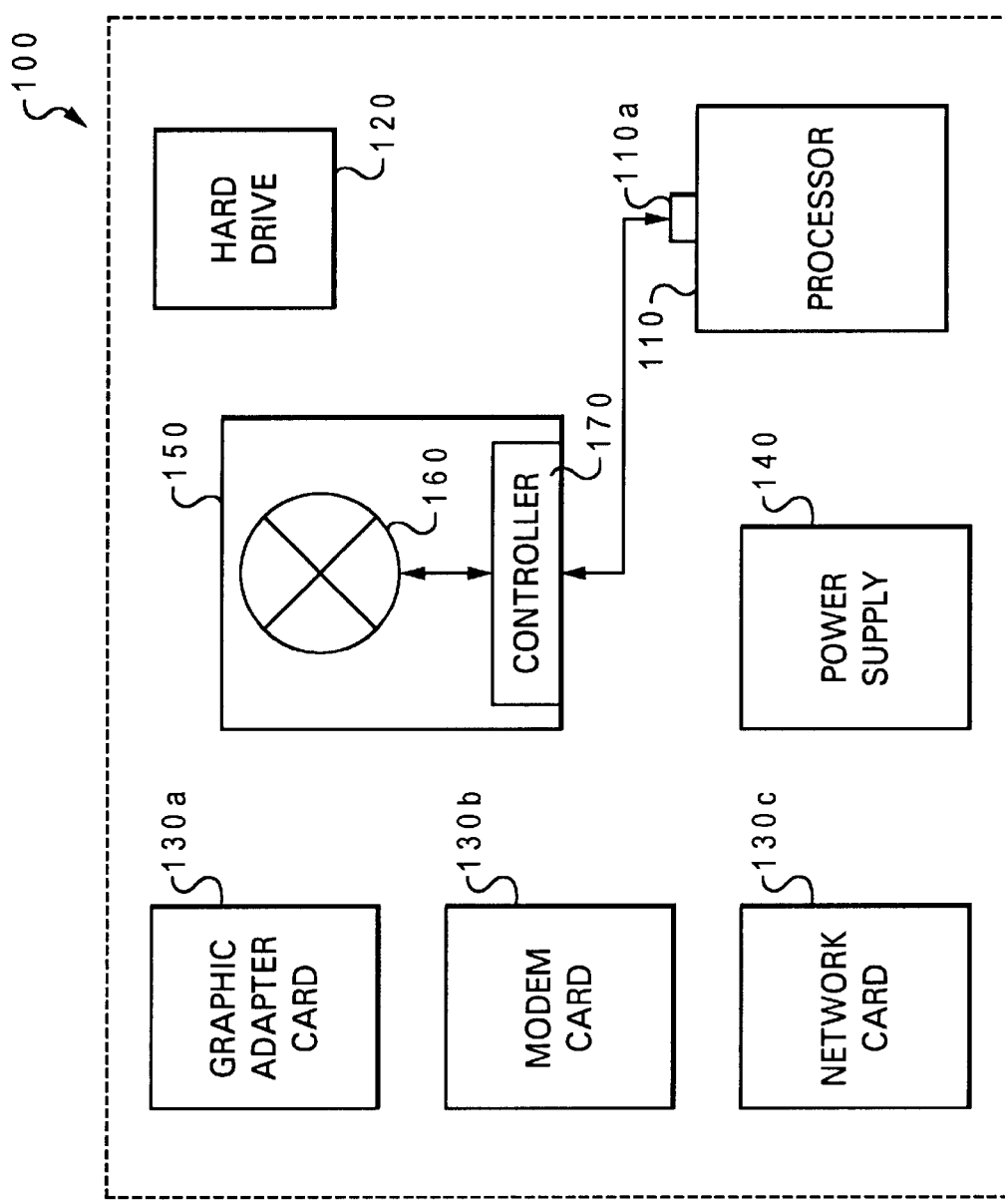
FIG. 1 illustrates an exemplary data processing system that provides a suitable environment for the practice of the present invention.

With reference now to the figures and in particular with reference to FIG. 1, there is depicted an exemplary data processing system 100 that provides a suitable environment for the practice of the present invention. Data processing system 100, such as a personal computer (PC), includes a processor 110, such as a conventional microprocessor, coupled to a number of electronic devices. As shown in the illustrated embodiment, the electronic devices generally include a power supply 140 for providing power, a non-volatile memory device, i.e., hard drive 120, and a plurality of circuit boards, generally designated 130a–130c, such as a graphic adapter card, modem card and network communication card. As discussed previously, these electronic devices generate heat when they are in operation. To dissipate the generated heat and prevent component failures due to elevated temperatures, an integrated fan assembly 150, having a variable speed fan 160 and an associated controller 170, is utilized in the illustrated embodiment to provide a means of removing the generated heat from an enclosure (not shown) that houses the electronic devices. The operation of integrated fan assembly 150 is monitored and controlled by processor 110 via a fan sense pin 110a. The construction and operation of integrated fan assembly 150 will hereinafter be described in greater detail with respect to FIG. 2, with continuing reference to FIG. 1.

Figure 2:
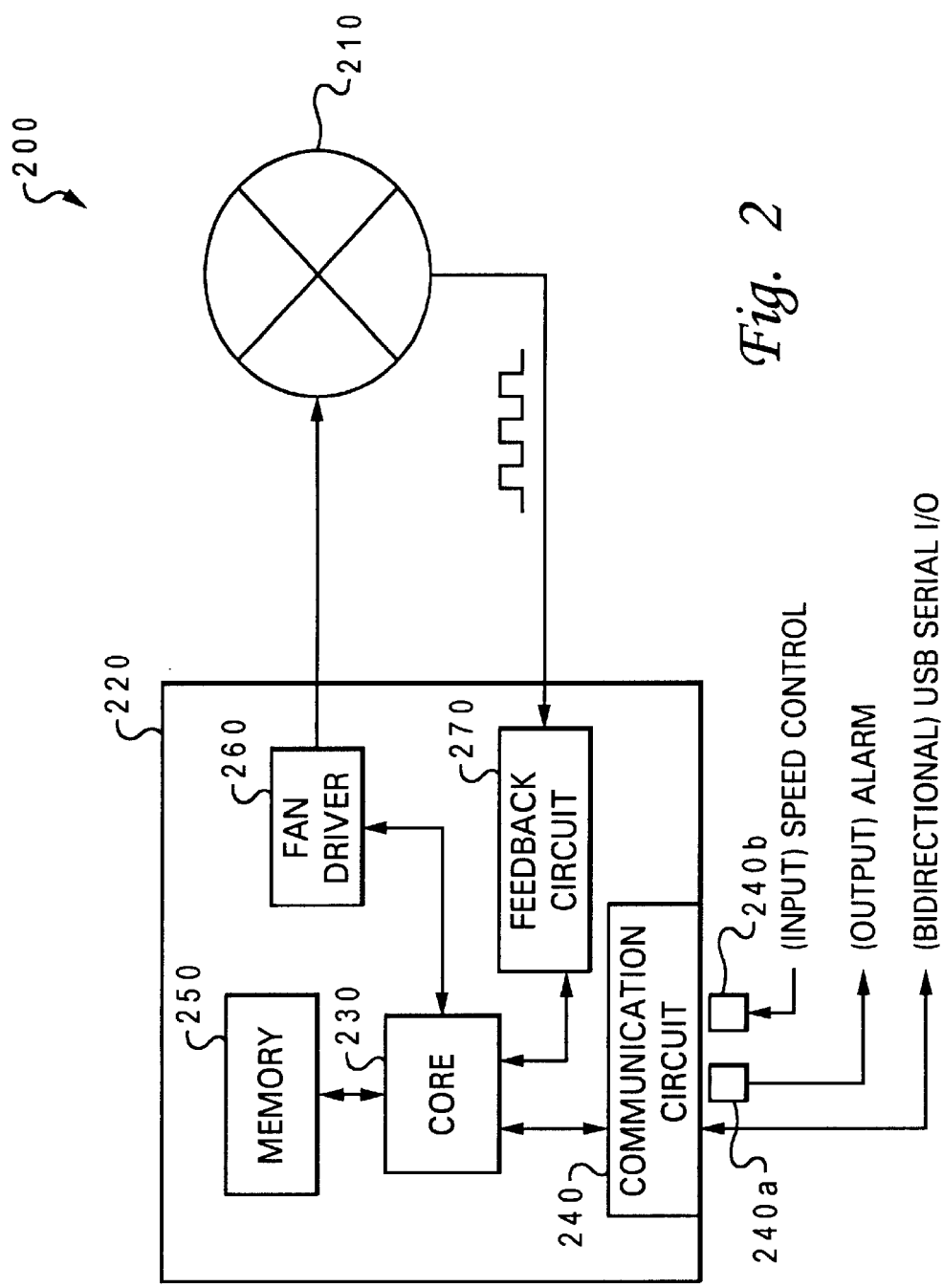
FIG. 2 illustrates an embodiment of an integrated fan assembly constructed according to the principles of the present invention.

Referring now to FIG. 2, there is illustrated an embodiment of an integrated fan assembly 200 constructed according to the principles of the present invention. Integrated fan assembly 200 (analogous to integrated fan assembly 150 shown in FIG. 1) includes a conventional variable speed fan 210 that, in an advantageous embodiment, is a brushless DC fan whose speed is directly proportional to a supplied DC voltage, or alternatively current, level provided from a fan controller 220. A feedback signal indicative of the speed of variable speed fan 210 is, in turn, provided to fan controller 220 to complete a closed loop control system.

Fan controller 220 includes a processor 230, a conventional microprocessor may be advantageously utilized, coupled to a communication circuit 240 that provides a means for communicating with an external processor, such as supervisory processor 110 depicted in FIG. 1. Communication circuit 240 includes a bidirectional USB serial I/O port managed by a universal asynchronous receiver-transmitter (UART), that allows for communication between the integrated fan assembly 200 and the external supervisory processor or other peripheral devices. This allows for supervisory processor 110 to set a speed of variable speed fan 210 and monitor its operation. Additionally, the serial I/O port allows for a speed setting to be "burned" into a memory device, e.g., a programable read-only memory (PROM), that is part of fan controller 220 during the manufacturing process. This, in turn, allows a single fan assembly to be utilized for systems having disparate cooling requirements. Different speed settings for the variable speed fan depending on the cooling requirements of the system utilizing the fan can be burned into the memory device of the fan controller during its assembly process, thus allowing for a single fan assembly to be inventoried, reducing overall costs in manufacturing and operation.

Communication circuit 240 also includes first and second transistor to transistor logic (TTL) signal pins 240a, 240b that provide for alarm and speed control, respectively. First signal pin 240a generates an output alarm signal typically to an external supervisory processor that indicates the operational status of variable speed fan 210. Second signal pin 240b typically receives a speed control signal from an external supervisory processor that sets the desired speed of variable speed fan 210. Alternatively, in another advantageous embodiment, first and second signal pins 240a, 240b allow for integrated fan assembly 200 to be operated as a standalone unit, i.e., no external or supervisory processor is required for the fan operation. An external control circuit, coupled to second signal pin 240b, may be utilized to control variable speed fan's 210 speed while first signal pin 240a may be tied to an alarm, such as a indicator on a control panel, to register a failure event.

A memory device 250 is also coupled to processor 230 and, in an advantageous embodiment, is an electrical erasable programable read-only memory (EEPROM) that provides a non-volatile memory for storing the speed settings of variable speed fan 210. Alternatively, in another embodiment, a flash memory device may be advantageously utilized. The utilization of these programable memory devices allows the speed of the variable speed fan 210 to be adjusted by an external controller, e.g., supervisory processor 110, to any desired setting based on external conditions, such as thermal and/or acoustic levels.

Fan controller 220 also includes a fan driver 260 and a feedback circuit 270 that are coupled to processor 230. As their name implies, fan driver 260 is utilized to provide the driving signal to operate variable speed fan 210 while feedback circuit 270 receives the speed feedback signal, e.g. a tach signal, from variable speed fan 210. In an advantageous embodiment, fan driver 260 is a conventional digital to analog converter (DAC) that converts a driving control signal from processor 230 based on the feedback signal received from feedback circuit 270 into an analog signal, e.g., a driving current, to operate variable speed fan 210 at a predetermined speed. In an advantageous embodiment, feedback circuit 270 is a counter that translates a tach feedback signal from variable speed fan 210 into a speed value that, in turn, is utilized by processor 230 to adjust the driving control signal. Additionally, in the event that feedback circuit's 270 signal indicates that variable speed fan 210 is not operating at the prescribed speed or not spinning at all, an alarm signal is generated by processor 230 to inform the supervisory processor that a failure condition has been encountered.

Figure 3A:
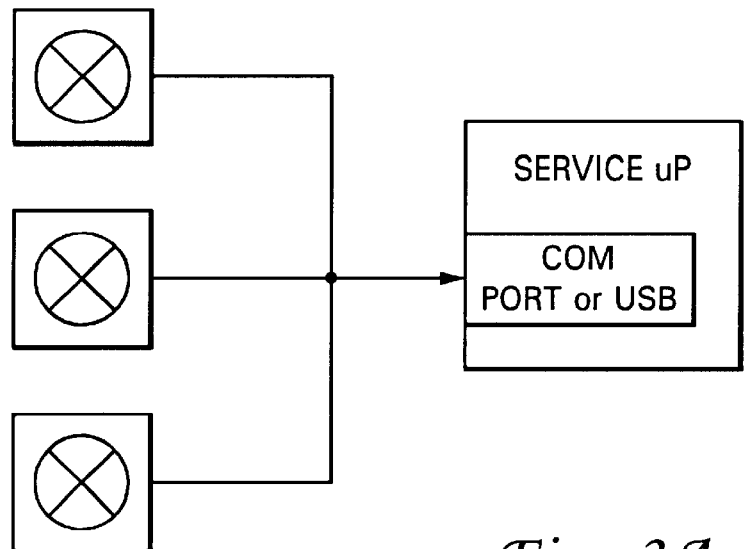
FIG. 3A illustrates a serial implementation where the communication circuits of the integrated fan assemblies are coupled to a communication port of a supervisory or service processor.
Figure 3B:
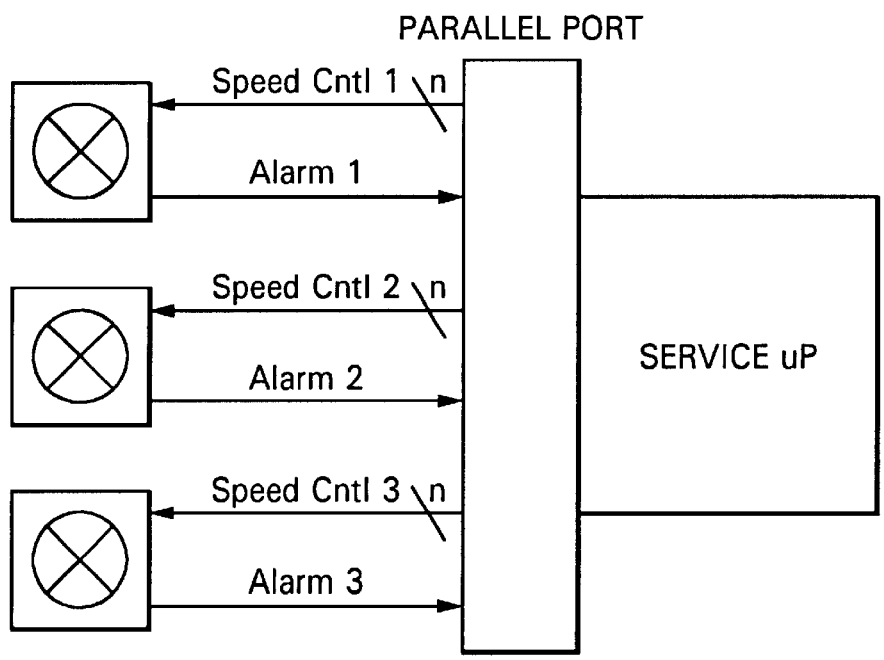
FIG. 3B illustrates a parallel implementation where the alarm and speed control signals from the integrated fan assemblies are coupled to a parallel port of a supervisory processor.
Figure 3C:
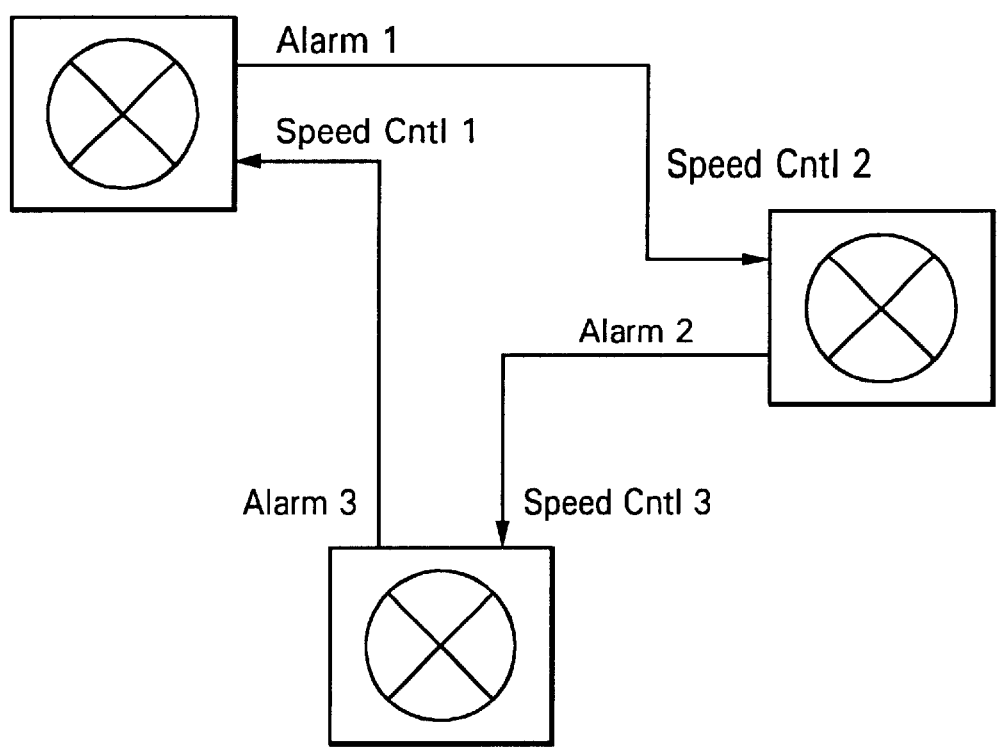
FIG. 3C illustrates a ring implementation where the alarm and control signals of the integrated fan assemblies are configured in a "daisy chain."

It should be noted that although fan controller 220 has been described above in the context of a collection of individual devices, in another advantageous embodiment, fan controller 220 may also be embodied in a microcontroller, such as the well-known 8051 microcontroller, available, e.g., from Intel Corporation. Turning now to FIGS. 3A–3C, there are depicted different configurations of multiple integrated fan assemblies. Specifically, FIG. 3A illustrates a serial implementation where the communication circuits of the integrated fan assemblies are coupled via a USB, I2C, RS232 link to a communication port, e.g., com port or USB port, of a supervisory or service processor. FIG. 3B depicts a parallel implementation where the alarm and speed control signals from the integrated fan assemblies are coupled to a parallel port of a supervisory processor. FIG. 3C illustrates a ring implementation where the alarm and control signals of the integrated fan assemblies are configured in a "daisy chain."

While the invention has been particularly shown and described with reference to a preferred embodiment, it will be understood by those skilled in the art that various changes in form and detail may be made therein without departing from the spirit and scope of the invention.

What is claimed is:

1. A fan controller for use with a variable speed fan, said fan controller comprising:
   a processor;
   a communication circuit, coupled to said processor, that allows an external controller to monitor a cooling requirement for a specific computer configuration and establish a single desired speed setting of said variable speed fan based on said cooling requirement for said specific computer configuration, said external controller being separate from said computer;
   a static programmable memory device, coupled to said processor, that contains said single desired speed setting of said variable speed fan, said single desired speed setting being previously programmed into said static programmable memory device by said external controller;
   a feedback circuit, coupled to said processor, that receives a feedback signal indicative of said variable speed fan operation; and
   a fan driver circuit, coupled to said processor, that provides a driving signal to control a speed of said variable speed fan, wherein a similar variable speed fan can be used in different computer configurations by establishing and storing a single desired speed setting in said static programmable memory device for use by said fan controller, and wherein said single desired speed setting is specific for said specific computer configuration.

2. The fan controller as recited in claim 1, wherein said communication circuit includes an universal asynchronous receiver transmitter (UART).

3. The fan controller as recited in claim 1, wherein said static programmable memory device is an electrically erasable programmable read only memory (EEPROM).

4. The fan controller as recited in claim 1, wherein said fan controller is embedded in a micro-controller.

5. The fan controller as recited in claim 1, wherein said feedback circuit includes a counter.

6. The fan controller as recited in claim 5, wherein said feedback signal indicative of the operation of said variable speed fan is a tach signal.

7. The fan controller as recited in claim 1, wherein said variable speed fan is a brushless DC fan.

8. The fan controller as recited in claim 1, wherein said fan driver circuit includes a digital to analog converter (DAC).

9. An integrated fan assembly, comprising:
   a variable speed fan, said variable speed fan generating a feedback signal indicative of said variable speed fan operation; and
   a fan controller, coupled to said variable speed fan, including:
   a processor;
   a communication circuit, coupled to said processor, that allows an external controller to monitor a cooling requirement for a specific computer configuration and establish a single desired speed setting of said variable speed fan based on said cooling requirement for said specific computer configuration, said external controller being separate from said computer;
   a static programmable memory device, coupled to said processor, that contains said single desired speed setting of said variable speed fan, said single desired speed setting being previously programmed into said static programmable memory device by said external controller;
   a feedback circuit, coupled to said processor, that receives a feedback signal indicative of said variable speed fan operation; and
   a fan driver circuit, coupled to said processor, that provides a driving signal to control a speed of said variable speed fan, wherein a similar variable speed fan can be used in different computer configurations by establishing and storing a single desired speed setting in said static programmable memory device for use by said fan controller, and wherein said single desired speed setting is specific for said specific computer configuration.

10. The integrated fan assembly as recited in claim 9, wherein said communication circuit includes an universal asynchronous receiver transmitter (UART).

11. The integrated fan assembly as recited in claim 9, wherein said static programmable memory device is an electrically erasable programmable read only memory (EEPROM).

12. The integrated fan assembly as recited in claim 9, wherein said feedback circuit includes a counter.

13. The integrated fan assembly as recited in claim 12, wherein said feedback signal indicative of the operation of said variable speed fan is a tach signal.

14. The integrated fan assembly as recited in claim 9, wherein said fan driver circuit includes a digital to analog converter (DAC).

15. A data processing system:
   a supervisory processor; and
   an integrated fan assembly, including:
      a variable speed fan, said variable speed fan generating a feedback signal indicative of said variable speed fan operation; and
      a fan controller, coupled to said variable speed fan, including:
         a processor;
         a communication circuit, coupled to said processor, that allows an external controller to monitor a cooling requirement for a specific computer configuration and establish a single desired speed setting of said variable speed fan based on said cooling requirement for said specific computer configuration, said external controller being separate from said computer;
         a static programmable memory device, coupled to said processor, that contains said single desired speed setting of said variable speed fan, said single desired speed setting being previously programmed into said static programmable memory device by said external controller;
         a feedback circuit, coupled to said processor, that receives a feedback signal indicative of said variable speed fan operation; and
         a fan driver circuit, coupled to said processor, that provides a driving signal to control a speed of said variable speed fan, wherein a similar variable speed fan can be used in different computer configurations by establishing and storing a single desired speed setting in said static programmable memory device for use by said fan controller, and wherein said single desired speed setting is specific for said specific computer configuration.

16. The data processing system as recited in claim 15, wherein said communication circuit includes an universal asynchronous receiver transmitter (UART).

17. The data processing system as recited in claim 15, wherein said static programmable memory device is an electrically erasable programmable read only memory (EEPROM).

18. The data processing system as recited in claim 15, wherein said feedback circuit includes a counter.

19. The data processing system as recited in claim 18, wherein said feedback signal indicative of the operation of said variable speed fan is a tach signal.

20. The data processing system as recited in claim 15, wherein said fan driver circuit includes a digital to analog converter (DAC).

* * * * *